(12) United States Patent
Ohta

(10) Patent No.: US 12,208,427 B2
(45) Date of Patent: Jan. 28, 2025

(54) ULTRASONIC TRANSDUCER HAVING STATE MONITORING FUNCTION AND ULTRASONIC CLEANING DEVICE USING THE SAME

(71) Applicant: KAIJO CORPORATION, Tokyo (JP)

(72) Inventor: Shugo Ohta, Tokyo (JP)

(73) Assignee: KAIJO CORPORATION, Tokyo (JP)

( * ) Notice: Subject to any disclaimer, the term of this patent is extended or adjusted under 35 U.S.C. 154(b) by 164 days.

(21) Appl. No.: 17/611,928

(22) PCT Filed: Jun. 5, 2020

(86) PCT No.: PCT/JP2020/022252
§ 371 (c)(1),
(2) Date: Nov. 17, 2021

(87) PCT Pub. No.: WO2021/245906
PCT Pub. Date: Dec. 9, 2021

(65) Prior Publication Data
US 2023/0085375 A1     Mar. 16, 2023

(51) Int. Cl.
*B08B 3/12*     (2006.01)
*B08B 13/00*    (2006.01)
(Continued)

(52) U.S. Cl.
CPC ............. *B08B 3/12* (2013.01); *B08B 13/00* (2013.01); *G01R 23/02* (2013.01); *G10K 15/04* (2013.01)

(58) Field of Classification Search
CPC .......... B08B 3/12; B08B 13/00; G01R 23/02; G10K 15/04; B06B 1/0246; B06B 1/0618;
(Continued)

(56) References Cited

U.S. PATENT DOCUMENTS 4,888,514 A * 12/1989 Takahashi ............... H02N 2/14
310/316.02
5,192,889 A * 3/1993 Myohga ................. H02N 2/14
318/116
(Continued)

FOREIGN PATENT DOCUMENTS

JP    3-289375 A    12/1991
JP    6-81359 B2    10/1994
(Continued)

OTHER PUBLICATIONS

Machine translation of JP-2005005294-A (Year: 2005).*
International Search Report (ISR) dated Aug. 11, 2020 filed in PCT/JP2020/022252.

*Primary Examiner* — Michael E Barr
*Assistant Examiner* — Thomas Bucci
(74) *Attorney, Agent, or Firm* — RANKIN, HILL & CLARK LLP

(57) ABSTRACT

Provided are an ultrasonic transducer having a state monitoring function, and an ultrasonic cleaning device using the same. The ultrasonic transducer having a state monitoring function is a Langevin ultrasonic transducer for use in an ultrasonic cleaning device configured to clean an object to be cleaned via cleaning liquid to which ultrasonic vibrations are applied, the ultrasonic transducer having a state monitoring function including a plurality of piezoelectric elements, which are arranged to be stacked on each other, and are expandable and contractable in a direction of the stacking, a part of the plurality of piezoelectric elements serving as a vibration exciting piezoelectric element configured to expand and contract by being applied with an AC voltage, another part of the plurality of piezoelectric elements serving as a state monitoring piezoelectric element configured to output a state monitoring voltage by the expansion and contraction of the vibration exciting piezoelectric element.

5 Claims, 10 Drawing Sheets

(51) Int. Cl.
*G01R 23/02* (2006.01)
*G10K 15/04* (2006.01)

(58) Field of Classification Search
CPC .... B06B 2201/71; B06B 1/0607; G01H 9/00; G01H 11/08
USPC ...................................................... 134/115 R
See application file for complete search history.

(56) References Cited

U.S. PATENT DOCUMENTS

| | | | | |
|---|---|---|---|---|
| 5,231,325 | A * | 7/1993 | Tamai | H02N 2/106 |
| | | | | 310/354 |
| 5,233,274 | A * | 8/1993 | Honda | H02N 2/106 |
| | | | | 318/116 |
| 5,656,881 | A * | 8/1997 | Atsuta | H02N 2/106 |
| | | | | 310/316.01 |
| 6,037,701 | A * | 3/2000 | Atsuta | H02N 2/106 |
| | | | | 318/116 |
| 6,274,963 | B1 * | 8/2001 | Estabrook | A61B 17/320068 |
| | | | | 310/316.02 |
| 7,336,019 | B1 * | 2/2008 | Puskas | B08B 3/12 |
| | | | | 310/317 |
| 8,830,003 | B2 * | 9/2014 | Hasegawa | H01L 21/67253 |
| | | | | 134/13 |
| 2002/0036444 | A1 * | 3/2002 | Yamashiro | D06F 19/00 |
| | | | | 310/322 |
| 2007/0205695 | A1 * | 9/2007 | Puskas | B01J 19/10 |
| | | | | 310/317 |
| 2009/0015096 | A1 * | 1/2009 | Puskas | B06B 1/0284 |
| | | | | 333/170 |
| 2011/0079253 | A1 * | 4/2011 | Hasegawa | B08B 3/12 |
| | | | | 134/184 |
| 2011/0290286 | A1 * | 12/2011 | Ohata | B06B 1/0207 |
| | | | | 134/184 |
| 2013/0048013 | A1 * | 2/2013 | Hasegawa | B08B 3/12 |
| | | | | 134/1 |
| 2015/0015115 | A1 * | 1/2015 | Aldaz | B06B 3/00 |
| | | | | 310/322 |
| 2018/0120148 | A1 * | 5/2018 | Caldwell | G01H 11/08 |
| 2018/0304308 | A1 * | 10/2018 | Ohnishi | B06B 1/0618 |

FOREIGN PATENT DOCUMENTS

| | | | | |
|---|---|---|---|---|
| JP | 8-308264 | A | | 11/1996 |
| JP | 2005005294 | A * | 1/2005 | ............ H01L 24/78 |
| JP | 3639102 | B2 | | 4/2005 |
| JP | 4926045 | B2 * | 5/2012 | ........... B06B 1/0618 |
| JP | 2014-144443 | A | | 8/2014 |
| JP | 2016-22438 | A | | 2/2016 |
| JP | 2019-58883 | A | | 4/2019 |
| JP | 2019058883 | A * | 4/2019 | |

* cited by examiner (a)

(b)

(a)

(b)

ULTRASONIC TRANSDUCER HAVING STATE MONITORING FUNCTION AND ULTRASONIC CLEANING DEVICE USING THE SAME

BACKGROUND OF THE INVENTION

1. Field of the Invention

The present invention relates to an ultrasonic transducer having a state monitoring function and an ultrasonic cleaning device using the same, in particular, an ultrasonic transducer having a state monitoring function, which is capable of easily monitoring a vibration state of an ultrasonic transducer, and an ultrasonic cleaning device using the same.

2. Description of the Related Art

In the related art, in order to detect a vibration state of an ultrasonic transducer in a cleaning bath of an ultrasonic cleaning device, vibration sensors, for example, acceleration sensors, are bonded to the cleaning bath to measure vibrations of the cleaning bath, to thereby monitor the vibration state of the ultrasonic transducer. Further, a sound pressure meter is placed in cleaning liquid of the cleaning bath to measure a magnitude of ultrasonic wave generated by the vibrations of the ultrasonic transducer in the cleaning liquid.

FIG. 12 is a view for illustrating positions of acceleration sensors attached to a cleaning bath of an ultrasonic cleaning device, and of a sound pressure meter in cleaning liquid. As illustrated in FIG. 12, acceleration sensors 57 are bonded to a cleaning bath 2 with an adhesive, and one acceleration sensor 57 is bonded to a surface of an ultrasonic transducer 7 to measure vibrations. Further, a magnitude of ultrasonic wave in cleaning liquid 3 is measured by a sound pressure meter 55. In this manner, the measurement relating to the vibration state of the ultrasonic transducer has often been performed by an indirect method via the cleaning bath and the cleaning liquid.

For example, as the indirect measurement of the vibration state of the transducer, in Japanese Patent No. 3639102, there is disclosed a wet treating device having a configuration in which a sound pressure meter is provided in an ultrasonic washing tank, to which washing liquid formed by dissolving washing functional gas in ultrapure water or deaerated ultrapure water is supplied, so that a sound pressure in the washing liquid for washing materials to be washed can be measured in the ultrasonic washing tank.

According to Japanese Patent No. 3639102, the wet treating device detects a change in dissolved quantity of the washing functional gas in the washing liquid, for example, as a change in sound pressure, and controls, based on measurement results of sound pressure, an ultrasonic radiated quantity, a washing functional gas quantity to be dissolved in the ultrapure water in a gas dissolving device, or a deaeration degree of impurity gas in a degassing device to be quantities required for washing the materials to be washed.

In Japanese Patent Application Laid-open No. 2014-144443, there is disclosed an ultrasonic cleaning apparatus with which sound noise having an audible frequency caused by ultrasonic vibrations is inhibited. The ultrasonic cleaning apparatus includes: an ultrasonic vibrator which vibrates a cleaning fluid in a cleaning tank by an ultrasonic wave to clean a cleaned object in the cleaning tank; a vibration sensor which detects vibrations occurring in the cleaning tank; a driving circuit which drives the ultrasonic vibrator to cause the ultrasonic wave to vibrate; and a control part which controls the driving circuit in accordance with a level of audible vibrations detected by the vibration sensor and changes a frequency of the ultrasonic wave.

In the ultrasonic cleaning apparatus of Japanese Patent Application Laid-open No. 2014-144443, in order to extract a vibration waveform of the entire cleaning bath including water surface vibrations, a strain gage is used as the vibration sensor to detect only a vibration waveform caused by contact propagation from the cleaning bath. The strain gage is bonded to an object to be measured, in which a strain occurs, via an electrical insulating material to measure the strain, through use of a principle that a metal (resistive element) expands and contracts to change a value of resistance in proportion to expansion and contraction of the object to be measured, with the change in resistance. The ultrasonic cleaning apparatus further includes a filter which extracts audible sound having a particular frequency from the detected vibrations, and the control part changes the frequency of the ultrasonic wave so that the audible sound having the particular frequency extracted by the filter is reduced to a level that is less than a predetermined threshold value. As a result, the sound noise having the audible frequency caused by the ultrasonic vibrations is inhibited.

Further, in Japanese Examined Patent Publication No. H06-81359, there is disclosed a method of monitoring a resonance state of a Langevin vibrator. According to Japanese Examined Patent Publication No. H06-81359, while laminated electrostrictive elements are used as a mechanical vibration source of the Langevin vibrator, at least one of the laminated electrostrictive elements is used as an electrostrictive element for monitor in a voltage-non impressing state. Mechanical vibrations of a vibrator are transferred to the electrostrictive element for monitor, and an output voltage (electric vibrations) proportional to the mechanical vibrations occurs in the electrostrictive element for monitor. An amplitude of the output voltage of the electrostrictive element for monitor takes a maximum value when the laminated electrostrictive elements and a horn vibrate in the resonance state. It is determined whether this output voltage for monitoring takes the maximum value to know whether the vibrator is in the resonance state. In this manner, a resonance frequency after the voltage applied to the vibration source (laminated electrostrictive elements) fluctuates is subjected to variable frequency control.

It is also possible to electrically detect an abnormality in an ultrasonic transducer by transducers. Specifically, it is possible to measure a current with which the ultrasonic transducer is driven by an oscillator, and electrically detect the abnormality in the ultrasonic transducer by a change in magnitude of the driving current. The oscillator which drives the ultrasonic transducer applies high-frequency power to a plurality of ultrasonic transducers connected in parallel to each other.

At this time, the oscillator supplies an electric current to the plurality of ultrasonic transducers connected in parallel to each other. For example, in a case in which the ultrasonic transducers are connected in parallel to each other, when an ultrasonic transducer fails, the driving current varies in accordance with a proportion the failed ultrasonic transducer forms with respect to a total number of ultrasonic transducers, and hence the abnormality of the ultrasonic transducer can be detected by detecting a change in driving current.

There is also known, as a method of directly measuring vibrations of transducers, laser Doppler measurement is known. FIG. 13 is a view for illustrating a configuration for measurement of vibrations at surfaces of ultrasonic transducers by a laser Doppler device.

As illustrated in FIG. 13, a laser Doppler device 50 irradiates surfaces of ultrasonic transducers 7 mounted to the bottom of a cleaning bath 2 with laser light from a laser irradiation unit 51, and a frequency and an amplitude of vibrations at the surfaces of the ultrasonic transducers 7 are measured by a main body processing unit 52 through use of the laser Doppler effect. A waveform or the like of the measured vibrations is displayed on a display device 53.

As described above, in the detection of the vibration state of the ultrasonic transducer in the ultrasonic cleaning bath, the sound pressure meter, and the vibration sensors, for example, the acceleration sensor, are used. However, in the case of monitoring the vibration state of the ultrasonic transducer by the sound pressure meter, the measurement is performed via water, and hence a fluctuation may occur in the measurement. In other words, a fluctuation in data observed by the sound pressure meter is considered to be an error due to a state (liquid temperature, dissolved gas, or the like) of the environment of the water in normal times. However, even when a ultrasonic transducer has failed, data observed by the sound pressure meter does not greatly differ from the error in normal times, and hence it cannot be determined whether the data indicates an error in normal times or is caused by the failure of the ultrasonic transducer.

Further, in the case of monitoring vibration states of the ultrasonic transducers by the acceleration sensors, it is required to bond the acceleration sensors to the cleaning bath or the ultrasonic transducer, and a difference occurs in the vibration states depending on locations at which the acceleration sensors are bonded. Still further, the acceleration sensors are fixed to the cleaning bath or the ultrasonic transducer with use of the adhesive, and hence measurement may become unstable due to adhesion failure or degradation of the adhesive. In this manner, there are uncertainties, for example, inability to stably measure the vibration states under the effects of the locations and bonding states of the sensors bonded to the cleaning bath or the ultrasonic transducer, and a fluctuation may occur in the measurement.

Yet further, in a case of electrically detecting an abnormality of an ultrasonic transducer by the oscillator, in an ultrasonic cleaning device, the number of ultrasonic transducers bonded to a diaphragm is in a range of from 20 to 30, and the ultrasonic transducers are connected in parallel to the oscillator. Therefore, a current observed on the oscillator side is a driving current supplied to the several tens of ultrasonic transducers, and even when an abnormality occurs in one ultrasonic transducer, a change in driving current is small, and does not greatly differ from the error observed in normal times. Therefore, with the ultrasonic cleaning device, it is difficult to detect the abnormality of the ultrasonic transducer with the change in driving current with use of the oscillator.

Meanwhile, the measurement by the laser Doppler device which directly measures vibrations of the ultrasonic transducers requires a large-scale device, and further, only one ultrasonic transducer can be measured for each set of the laser Doppler device, and hence simultaneous measurement of a plurality of used ultrasonic transducers is difficult.

Further, with the laser Doppler device, laser should be applied from directly below the ultrasonic transducer. Therefore, a measurement environment is limited, and further because of being the large-scale device, it is difficult to be brought into a production site.

As described above, in order to directly measure the vibration states, a large-scale device is required, and further because of being an expensive device, it is impractical to be provided for each device.

Therefore, there is demanded a device for monitoring vibration states, which can directly measure the vibration states of the ultrasonic transducers as with the laser Doppler device in place of indirect measurement by the sound pressure meter, the acceleration sensors, or the like, has a simple configuration, and is inexpensive.

SUMMARY OF THE INVENTION

In view of the above-mentioned circumstances, in order to solve the above-mentioned problems, the inventors have found as a result of trial and error that, under a situation in which a vibration transmitting medium, that is, cleaning liquid exists, a part of piezoelectric elements in a Langevin ultrasonic transducer can be used to detect not only a state of the ultrasonic transducer but also states of ultrasonic transducers around the ultrasonic transducer based on a voltage output from the piezoelectric element through expansion and contraction without applying an AC voltage.

Therefore, the present invention has an object to provide an ultrasonic transducer having a state monitoring function, which is a Langevin ultrasonic transducer including a plurality of piezoelectric elements, a part of the plurality of piezoelectric elements serving as a vibration exciting piezoelectric element configured to expand and contract by being applied with an AC voltage, another part of the plurality of piezoelectric elements serving as a state monitoring piezoelectric element, which is configured to output a state monitoring voltage by the expansion and contraction without being applied with the AC voltage, so that vibrations and other states can be monitored stably, and an ultrasonic cleaning device using the ultrasonic transducer having a state monitoring function.

In order to achieve the above-mentioned object, according to at least one embodiment of the present invention, there is provided an ultrasonic transducer having a state monitoring function, which is a Langevin ultrasonic transducer for use in an ultrasonic cleaning device configured to clean an object to be cleaned via cleaning liquid to which ultrasonic vibrations are applied, the ultrasonic transducer having a state monitoring function including a plurality of piezoelectric elements, which are arranged to be stacked on each other, and are expandable and contractable in a direction of the stacking, a part of the plurality of piezoelectric elements serving as a vibration exciting piezoelectric element configured to expand and contract by being applied with an AC voltage, another part of the plurality of piezoelectric elements serving as a state monitoring piezoelectric element, which is fixed to the vibration exciting piezoelectric element in a pressurized state, and is configured to output a state monitoring voltage by the expansion and contraction of the vibration exciting piezoelectric element.

Further, according to at least one embodiment of the present invention, there is provided an ultrasonic cleaning device, which is the ultrasonic cleaning device configured to: apply ultrasonic vibrations to the cleaning liquid by the ultrasonic transducer having a state monitoring function; and monitor a state of the ultrasonic transducer having a state monitoring function with a change in at least one of an amplitude or a frequency of the state monitoring voltage output from the state monitoring piezoelectric element.

Further, the ultrasonic cleaning device according to the at least one embodiment of the present invention is configured to perform abnormality determination on the ultrasonic transducer having a state monitoring function by comparing at least one of the amplitude or the frequency of the state monitoring voltage output from the state monitoring piezoelectric element of the ultrasonic transducer having a state monitoring function, and at least one of an amplitude or a frequency of the state monitoring voltage output from the state monitoring piezoelectric element at a time when the ultrasonic transducer having a state monitoring function is driven in a normal state.

Further, according to at least one embodiment of the present invention, there is provided an ultrasonic cleaning device, which is the ultrasonic cleaning device configured to: apply ultrasonic vibrations to the cleaning liquid by a plurality of ultrasonic transducers, a part of the plurality of ultrasonic transducers being formed of the ultrasonic transducer having a state monitoring function of the at least one embodiment of the present invention; and monitor a state of the ultrasonic cleaning device with a change in at least one of an amplitude or a frequency of the state monitoring voltage output from the state monitoring piezoelectric element of the ultrasonic transducer having a state monitoring function.

Further, the ultrasonic cleaning device according to the at least one embodiment of the present invention is configured to perform abnormality determination on the ultrasonic cleaning device by comparing at least one of the amplitude or the frequency of the state monitoring voltage output from the state monitoring piezoelectric element of the ultrasonic transducer having a state monitoring function, and at least one of an amplitude or a frequency of the state monitoring voltage output from the state monitoring piezoelectric element of the ultrasonic transducer having a state monitoring function at a time when the ultrasonic cleaning device is driven in a normal state.

Further, in the ultrasonic cleaning device according to the at least one embodiment of the present invention, a plurality of the ultrasonic transducers having a state monitoring function are arranged, and the ultrasonic cleaning device is configured to estimate a position of one of the plurality of the ultrasonic transducers in an abnormal state with a change in at least one of an amplitude or a frequency of the state monitoring voltage output from the state monitoring piezoelectric element of each of the plurality of the arranged ultrasonic transducers having a state monitoring function, from a position of the state monitoring piezoelectric element from which the change is detected.

Further, in the ultrasonic cleaning device according to the at least one embodiment of the present invention, the detection of the change in the plurality of the arranged ultrasonic transducers having a state monitoring function is performed by comparing at least one of the amplitude or the frequency of the state monitoring voltage output from the state monitoring piezoelectric element of each of the plurality of the arranged ultrasonic transducers having a state monitoring function, and at least one of an amplitude or a frequency of the state monitoring voltage output from the state monitoring piezoelectric element of each of the plurality of arranged ultrasonic transducers having a state monitoring function at a time when the ultrasonic cleaning device is driven in a normal state.

Further, according to at least one embodiment of the present invention, there is provided an ultrasonic cleaning device, which is the ultrasonic cleaning device configured to: apply ultrasonic vibrations to the cleaning liquid by a plurality of ultrasonic transducers, a part of the plurality of ultrasonic transducers being formed of the ultrasonic transducer having a state monitoring function the at least one embodiment of the present invention; and analyze voltage waveforms, which are different for ultrasonic vibrations respectively generated from the plurality of ultrasonic transducers arranged around the ultrasonic transducer having a state monitoring function, from the state monitoring voltage output from the state monitoring piezoelectric element of the ultrasonic transducer having a state monitoring function, to estimate one of the plurality of ultrasonic transducers in an abnormal state from amplitudes and phases of the voltage waveforms.

Further, in the ultrasonic cleaning device according to the at least one embodiment of the present invention, the estimation of the one of the plurality of ultrasonic transducers in the abnormal state is performed by estimating presence of the one of the plurality of ultrasonic transducers in the abnormal state from a reduction in amplitude of one of the voltage waveforms, and estimating a distance to the one of the plurality of ultrasonic transducers in the abnormal state from a phase difference.

Further, in the ultrasonic cleaning device according to the at least one embodiment of the present invention, the estimation of the one of the plurality of ultrasonic transducers in the abnormal state in the ultrasonic transducer having a state monitoring function is performed by analyzing, from the state monitoring voltage output from the state monitoring piezoelectric element of the ultrasonic transducer having a state monitoring function at a time when the ultrasonic cleaning device is driven in a normal state, voltage waveforms, which are different for ultrasonic vibrations respectively generated from the plurality of ultrasonic transducers arranged around the ultrasonic transducer having a state monitoring function, and comparing with amplitudes and phases of the voltage waveforms.

The ultrasonic transducer having a state monitoring function according to the at least one embodiment of the present invention can detect, by embedding the another part of the plurality of piezoelectric elements as the state monitoring piezoelectric element, an abnormality of the ultrasonic transducer having a state monitoring function based on an amplitude or a frequency of the voltage detected by the state monitoring piezoelectric element.

Further, in the ultrasonic transducer having a state monitoring function according to the at least one embodiment of the present invention, the another part of the plurality of piezoelectric elements is incorporated as the state monitoring piezoelectric element, and hence an abnormal state of vibrations of not only the ultrasonic transducer having a state monitoring function itself but also ultrasonic transducers provided around the ultrasonic transducer having a state monitoring function can be detected with high accuracy.

According to the ultrasonic transducer having a state monitoring function of the at least one embodiment of the present invention, the vibrations of the ultrasonic transducers can be observed directly, and hence no large-scale device is required.

Further, the state monitoring piezoelectric element as the sensor is embedded in a related-art ultrasonic transducer itself, and no space for the sensor is required, and hence the configuration can be simplified. Further, a method of attaching the ultrasonic transducer having a state monitoring function to the cleaning bath is the same as in the related art, and no change to assembly steps for the ultrasonic cleaning device is required.

Further, when a plurality of the ultrasonic transducers having a state monitoring function are incorporated, an ultrasonic transducer at an abnormality location can be identified.

According to the ultrasonic cleaning device using the ultrasonic transducer having a state monitoring function of the at least one embodiment of the present invention, with the provision of the ultrasonic transducer having a state monitoring function, vibration states of the ultrasonic transducers in the cleaning bath can be monitored based on an output voltage from the state monitoring piezoelectric element.

Further, in the ultrasonic transducer having a state monitoring function of the at least one embodiment of the present invention, the plurality of piezoelectric elements are arranged to be stacked on each other, and the another part of the plurality of piezoelectric elements is fixed in a pressurized state as the state monitoring piezoelectric element, as opposed to the related-art sensor, which is attached by bonding, for example, and hence no variation in measurement due to peeling of the sensor, adhesion failure, or degradation of the adhesive occurs.

Still further, the ultrasonic transducer having a state monitoring function according to the at least one embodiment of the present invention can be used not only for the ultrasonic transducers of the ultrasonic cleaning device which irradiate the cleaning bath with ultrasonic wave for cleaning, but also for ultrasonic transducers, for example, a spot shower, a line shower, and a throw-in ultrasonic transducer. Yet further, those ultrasonic transducers can be applied to a cleaning device which cleans an object to be cleaned from the ultrasonic transducers via the cleaning liquid.

BRIEF DESCRIPTION OF THE DRAWINGS

FIG. 11A and FIG. 11B are a view and graphs for illustrating and showing estimation of a failed ultrasonic transducer with use of, in addition to amplitudes of output voltages from an ultrasonic transducer having a state monitoring function, a phase difference of the output voltages, in which FIG. 11A is a view for illustrating arrangement of an ultrasonic transducer having a state monitoring function and ultrasonic transducers, FIG. 11B is a graph for showing waveforms of output voltages from the ultrasonic transducer having a state monitoring function caused by the transducers in the normal state, and FIG. 11C is a graph for showing waveforms of output voltages from the ultrasonic transducer having a state monitoring function caused by the transducers in an abnormal state of one ultrasonic transducer.

DESCRIPTION OF THE EMBODIMENTS

Figure 1:
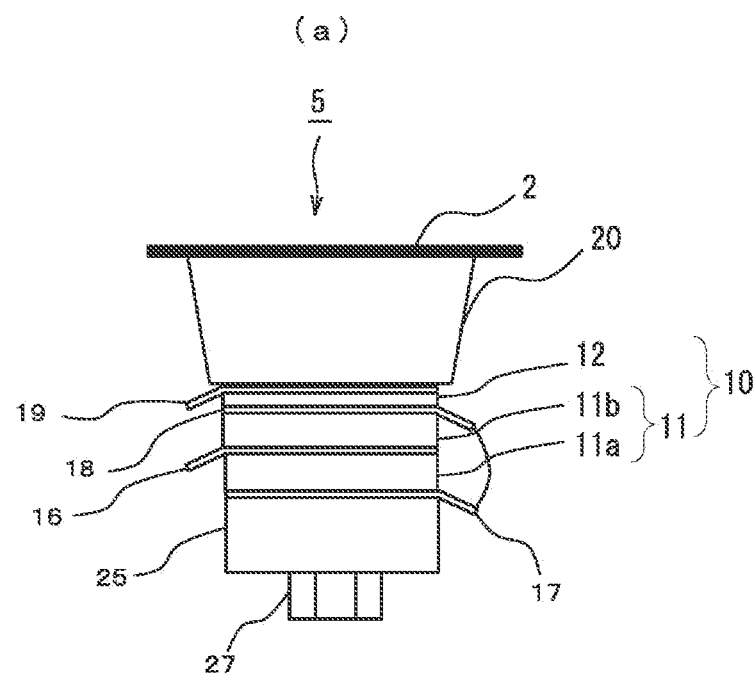
FIG. 1A is a view for illustrating a configuration of an ultrasonic transducer having a state monitoring function.
FIG. 1B is an exploded view for illustrating the configuration of the ultrasonic transducer having a state monitoring function.
Figure 1:
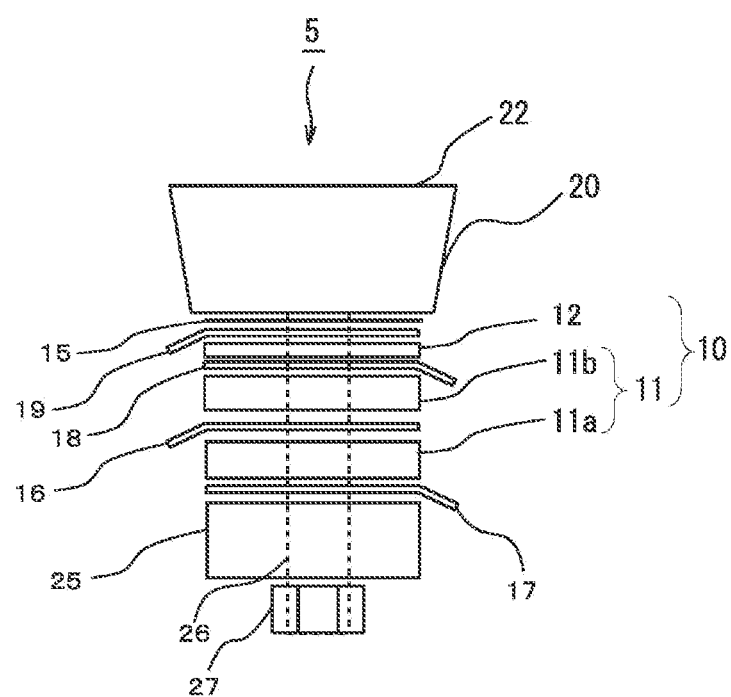

Now, referring to the drawings, description is given of modes for carrying out an ultrasonic transducer having a state monitoring function according to at least one embodiment of the present invention and an ultrasonic cleaning device using the same. The ultrasonic transducer having a state monitoring function of the at least one embodiment of the present invention includes vibration exciting piezoelectric elements which generate ultrasonic vibrations, and a state monitoring piezoelectric element which monitors a vibration state, and the state monitoring piezoelectric element is provided in the ultrasonic transducer so that the vibration state in a cleaning bath, for example, can be monitored.

[Configuration of Ultrasonic Transducer Having State Monitoring Function]

First, a configuration of the ultrasonic transducer having a state monitoring function is described with reference to the drawings. FIG. 1A is a view for illustrating the configuration of the ultrasonic transducer having a state monitoring function. FIG. 1B is an exploded view for illustrating the configuration of the ultrasonic transducer having a state monitoring function.

As illustrated in FIG. 1A and FIG. 1B, an ultrasonic transducer 5 having a state monitoring function is a Langevin transducer, and includes a plurality of piezoelectric elements 10, which are arranged to be stacked on each other, and are expandable and contractable in a direction of the stacking, a part of the plurality of piezoelectric elements 10 including vibration exciting piezoelectric elements 11 (11a and 11b illustrated in FIG. 1A and FIG. 1B), which expand and contract by being applied with an AC voltage having a predetermined frequency, another part of the plurality of piezoelectric elements 10 including a state monitoring piezoelectric element 12, which outputs a state monitoring voltage by expansion and contraction without being applied with the AC voltage. For example, the ultrasonic transducer 5 having a state monitoring function is a bolted Langevin transducer, and the state monitoring piezoelectric element 12 is fixed to the vibration exciting piezoelectric elements 11 under a pressurized state. The ultrasonic transducer 5 having a state monitoring function is not limited to a bolted Langevin transducer, and may be an ultrasonic transducer in which the state monitoring piezoelectric element 12 is pressurized to the vibration exciting piezoelectric elements 11 by another fixing method.

Further, the ultrasonic transducer 5 having a state monitoring function includes: a horn 20 (front surface plate) which transfers vibrations of the vibration exciting piezoelectric elements 11, and receives vibrations from the outside to be transferred to the state monitoring piezoelectric element 12; an electrode plate 16, 17, or 18 for applying the AC voltage to the vibration exciting piezoelectric elements 11; electrode plates 19 and 18 for outputting the voltage from the state monitoring piezoelectric element 12; a backing plate 25 paired with the horn 20; and a bolt 26 and a nut 27 for fastening the horn 20, the state monitoring piezoelectric element 12, the vibration exciting piezoelectric elements 11, the electrode plates 16, 17, and 18, and the backing plate 25 to be coupled and fixed. An end surface opposite to an end surface of the horn 20 that is on the state monitoring piezoelectric element 12 side is an output end 22 that is in contact with a cleaning bath 2.

Each of the vibration exciting piezoelectric elements 11a and 11b is a piezoelectric ceramic being an electrostrictive element formed into a ring shape, the electrode plates 16 and 17 are in contact with the entire main surfaces of both surfaces of the vibration exciting piezoelectric element 11a formed into the ring shape, and the electrode plates 16 and 18 are in contact with the entire main surfaces of both surfaces of the vibration exciting piezoelectric element 11b formed into the ring shape. Further, the state monitoring piezoelectric element 12 is a piezoelectric ceramic being an electrostrictive element formed into a ring shape, and the electrode plates 19 and 18 are in contact with the entire main surfaces of both surfaces formed into the ring shape. The vibration exciting piezoelectric elements 11 and the state monitoring piezoelectric element 12 are formed of the same material and the same shape of the main surface. The ultrasonic transducer 5 having a state monitoring function illustrated in FIG. 1A and FIG. 1B shows an example in which two vibration exciting piezoelectric elements 11 (11a and 11b illustrated in FIG. 1A and FIG. 1B) are used. The number of vibration exciting piezoelectric elements 11 is not limited to two, and may be one or a multiple of two. Further, the vibration exciting piezoelectric elements 11 and the state monitoring piezoelectric element 12 are not limited to the same shape of the main surface.

In the ultrasonic transducer 5 having a state monitoring function, the electrode plate 19 on one surface of the state monitoring piezoelectric element 12 is in contact with a surface of one end surface of the horn 20 via an insulating material 15, and the other surface of the state monitoring piezoelectric element 12 and one surface of the vibration exciting piezoelectric element 11b are in contact with each other via the electrode plate 18. Further, one surface of the vibration exciting piezoelectric element 11a is in contact with the other surface of the vibration exciting piezoelectric element 11b via the electrode plate 16, and the other surface of the vibration exciting piezoelectric element 11a is in contact with the backing plate 25 via the electrode plate 17. The bolt 26 penetrates through ring openings located near the center of the respective piezoelectric elements, and the horn 20, the state monitoring piezoelectric element 12, the vibration exciting piezoelectric elements 11a and 11b, and the backing plate 25 are integrally coupled under a pressurized state by the bolt 26 and the nut 27 through the bolt 26.

Further, the electrode plate 18 stacked between, and in contact with, the state monitoring piezoelectric element 12 and the vibration exciting piezoelectric element 11b is electrically connected to the electrode plate 17 of the vibration exciting piezoelectric element 11a.

Still further, the electrode plate 16 that is in contact with the surfaces of the vibration exciting piezoelectric elements 11a and 11b forms a positive (+) side, the electrode plate 17 that is in contact with the vibration exciting piezoelectric element 11a and the electrode plate 18 that is in contact with the vibration exciting piezoelectric element 11b form a negative (−) side, and electric power is supplied from an oscillator 30 (illustrated in FIG. 2) via those electrode plates. The electrode plate 19 is the positive (+) side, and the voltage of the state monitoring piezoelectric element 12 is output to a monitoring unit section 35 (illustrated in FIG. 2) of the oscillator 30 via the electrode plate 19 and the electrode plate 18 on the negative (−) side.

In this manner, the state monitoring piezoelectric element 12 of the ultrasonic transducer 5 having a state monitoring function is configured to output the state monitoring voltage by the expansion and contraction of the vibration exciting piezoelectric elements 11.

Configuration of Ultrasonic Cleaning Device

Figure 2:
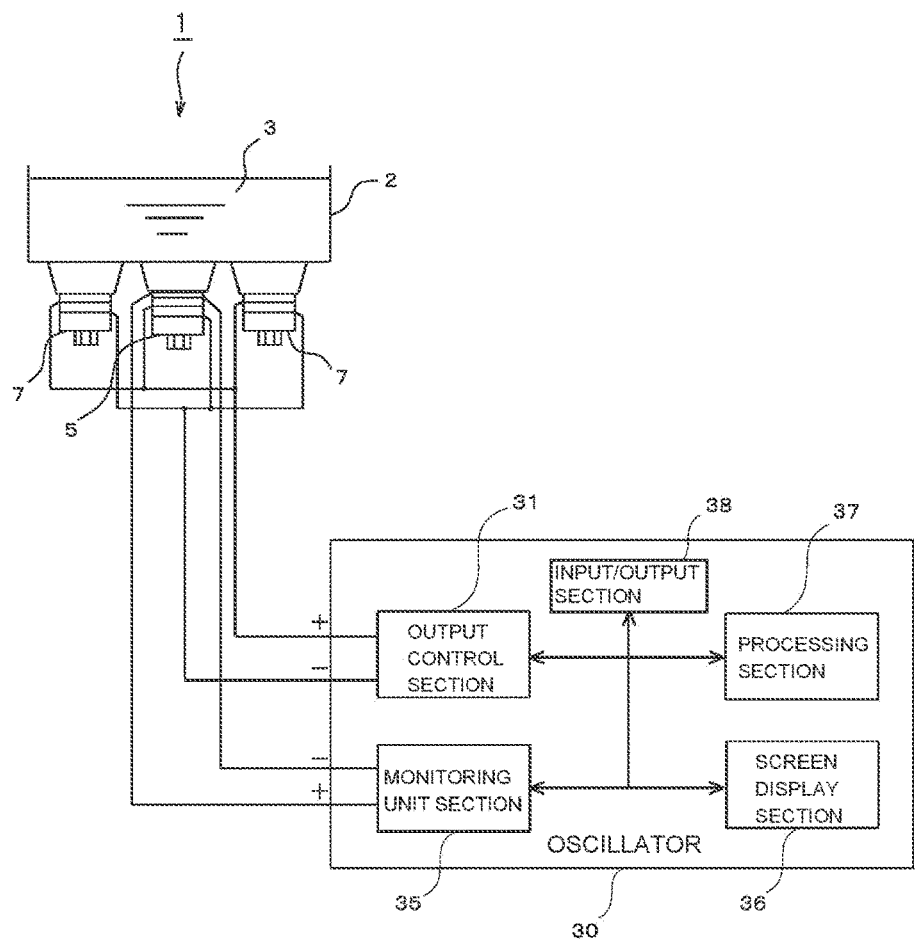
FIG. 2 is a diagram for illustrating configurations of a cleaning bath in which the ultrasonic transducer having a state monitoring function is used in an ultrasonic cleaning device, and an oscillator.

Next, an embodiment in which the ultrasonic transducer 5 having a state monitoring function is used in the cleaning bath 2 of an ultrasonic cleaning device is described with reference to FIG. 2. FIG. 2 is a diagram for illustrating configurations of the ultrasonic cleaning device and the oscillator, in which an ultrasonic transducer having a state monitoring function is used in the ultrasonic cleaning device.

As illustrated in FIG. 2, at a position near the center of the bottom of the cleaning bath 2 of an ultrasonic cleaning device 1, the ultrasonic transducer 5 having a state monitoring function is mounted. The cleaning bath 2 and the output end 22 of the horn 20 of the ultrasonic transducer 5 having a state monitoring function are bonded by an adhesive, for example. The fixing of the ultrasonic transducer 5 having a state monitoring function to the cleaning bath 2 is not limited to the fixing by the adhesive, and may be performed by another fixing method.

Further, on both sides of the ultrasonic transducer 5 having a state monitoring function, ultrasonic transducers 7 including only the vibration exciting piezoelectric elements 11 (hereinafter simply referred to as "ultrasonic transducers 7") are provided.

Still further, as illustrated in FIG. 2, the ultrasonic transducer 5 having a state monitoring function and the ultrasonic transducers 7 in the ultrasonic cleaning device 1 are connected to the oscillator 30 via cables. The configuration of the oscillator 30 is described below with reference to the drawing. The oscillator 30 includes an output control section 31, the monitoring unit section 35, a screen display section 36, a processing section 37, and an input/output section 38. To the output control section 31, the monitoring unit section 35, the screen display section 36, and the input/output section 38, the processing section 37 is connected.

The output control section 31 of the oscillator 30 includes an oscillation device (not shown), a voltage amplifier circuit (not shown), and a power amplification device (not shown) to amplify a high-frequency signal of the oscillation device in the voltage amplifier circuit, and the power amplification device amplifies in power the voltage from the voltage amplifier circuit to apply high-frequency power to the vibration exciting piezoelectric elements 11 of the ultrasonic transducers 7 and the ultrasonic transducer 5 having a state monitoring function. The output control section 31 can output variable high-frequency power, for example, high-frequency power of from 0 watts (W) to 600 W.

The monitoring unit section 35 is input with the output voltage from the state monitoring piezoelectric element 12 of the ultrasonic transducer 5 having a state monitoring function, amplifies or attenuates the input voltage, and outputs the amplified or attenuated voltage to the screen display section 36.

The screen display section 36 is a display device which can display characters, waveforms, graphics, and the like, and is formed of a display which displays the waveforms measured by the monitoring unit section 35, for example.

Further, the processing section 37 of the oscillator 30 includes a computer, and the processing section 37 executes a program of the computer to store waveform data and process waveform data of the ultrasonic transducer 5 having a state monitoring function and the ultrasonic transducers 7 measured by the monitoring unit section 35, to thereby monitor the vibration state by the ultrasonic transducer 5 having a state monitoring function and the ultrasonic transducers 7. Still further, the processing section 37 can control the oscillator 30 to control a magnitude of output power to be applied to the ultrasonic transducers 7 and the ultrasonic transducer 5 having a state monitoring function. Yet further, when it is determined that the vibration state is abnormal, the application of the AC voltage (power) to the ultrasonic transducers 7 by the oscillator 30 can be stopped.

The input/output section 38 enables inputs and outputs to and from the oscillator 30, and is formed of input means for operating the oscillator 30, for example, a keyboard, a mouse, or a touch panel, and data output means, for example, a port for connection to a printer or an external device.

In the ultrasonic cleaning device 1 having the above-mentioned configuration, AC power from the oscillator 30 is applied to the vibration exciting piezoelectric elements 11 of the ultrasonic transducers 7 and the ultrasonic transducer 5 having a state monitoring function. At this time, the voltage is output from the state monitoring piezoelectric element 12 of the ultrasonic transducer 5 having a state monitoring function.

It should be understood that, instead of the processing section 37 of the oscillator 30, an external processing unit (not shown) formed of an external PC may be connected to the input/output section 38 formed of an input/output device to provide a function similar to that of the processing section 37. It should also be understood that both of the processing section 37 of the oscillator 30 and the external processing unit (not shown) formed of the external PC are used to complement each other's function.

Regarding State Monitoring Function

Figure 13:
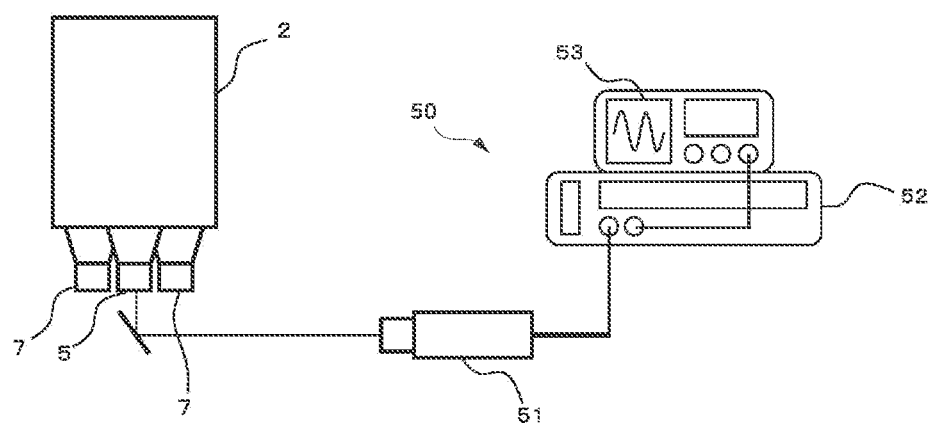
FIG. 13 is a view for illustrating, as a related art, a configuration for measurement of vibrations at surfaces of transducers by a laser Doppler device.

Next, description is given of results of measuring an amplitude by a laser Doppler device 50 illustrated in FIG. 13 and measuring the output voltage by the state monitoring piezoelectric element 12 of the ultrasonic transducer 5 having a state monitoring function with respect to the magnitude of the output power applied to the ultrasonic transducer 5 having a state monitoring function illustrated in FIG. 2.

Figure 3:
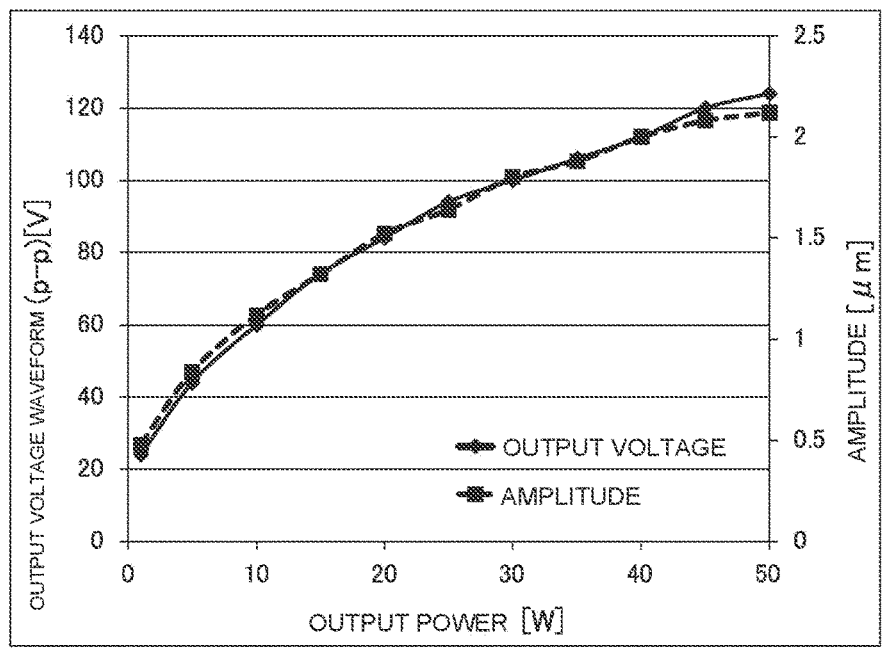
FIG. 3 is a graph for showing results of measurement by a laser Doppler device and measurement by a state monitoring piezoelectric element of the ultrasonic transducer having a state monitoring function with respect to a magnitude of output power applied to the ultrasonic transducer having a state monitoring function.

FIG. 3 is a graph for showing the results of the measurement by the laser Doppler device and the measurement of the voltage by the state monitoring piezoelectric element of the ultrasonic transducer having a state monitoring function with respect to the magnitude of the output power of the oscillator applied to the ultrasonic transducer having a state monitoring function. Vertical axes illustrated in FIG. 3 indicate a magnitude of the amplitude measured by the laser Doppler device in micrometers (μm), and a magnitude of the amplitude of the output power measured by the state monitoring piezoelectric element 12 of the ultrasonic transducer 5 having a state monitoring function in volts (V).

As shown in FIG. 3, amplitude measurement values (μm) indicated by "■" (black squares) from the laser Doppler device and output voltage measurement values (V) indicated by "♦" (black diamonds) from the state monitoring piezoelectric element 12 with respect to the magnitude of the output power (W) applied to the ultrasonic transducer 5 having a state monitoring function form substantially the same curve with respect to the output power (applied power) of the oscillator. Therefore, monitoring of the vibration state based on a change in amplitude of the output voltage measured by the state monitoring piezoelectric element 12 of the ultrasonic transducer 5 having a state monitoring function is effective, and it was confirmed that state monitoring with high accuracy can be performed.

Further, the ultrasonic cleaning device 1 can apply the ultrasonic vibrations to cleaning liquid by the ultrasonic transducer 5 having a state monitoring function fixed to the outside of the cleaning bath 2, analyze voltage waveforms output from the state monitoring piezoelectric element 12, and monitor a state of the ultrasonic transducer 5 having a state monitoring function based on a change in frequency of the voltage.

For example, with a magnitude of a fastening torque at the time of fixing the cleaning bath 2 and a transducer with a screw, for example, the frequency of the voltage output from the state monitoring piezoelectric element 12 is changed. As an example, when the fastening torque of the transducer has a normal magnitude, the frequency of the voltage output from the state monitoring piezoelectric element 12 was 5.94 kilohertz (KHz). In contrast, when the fastening torque of the transducer is smaller than the normal magnitude, the frequency of the voltage output from the state monitoring piezoelectric element 12 was 6.28 KHz, and the frequency of the voltage output from the state monitoring piezoelectric element 12 was increased as compared to the normal torque. Consequently, from the frequency of the voltage output from the state monitoring piezoelectric element 12, degradation of the ultrasonic transducer 5 having a state monitoring function, peeling from the cleaning bath, and oscillation failure due to loosening of the bolt caused by a change with time, for example, can be detected.

In other words, in attachment failure of the ultrasonic transducer 5 having a state monitoring function to the cleaning bath, adhesion failure of an ultrasonic transducer to the cleaning bath, and bonding degradation, a load on the ultrasonic transducer 5 having a state monitoring function is reduced, and hence an increase in frequency of the voltage output from the state monitoring piezoelectric element 12 occurs. Further, also during boil dry at a time when there is no cleaning liquid in the cleaning bath 2 of the ultrasonic cleaning device 1, an increase in frequency of the voltage output from the state monitoring piezoelectric element 12 occurs, and hence an abnormality of the ultrasonic transducer can be detected by checking the increase in frequency of the voltage. Further, during boil dry, resonance impedance of the ultrasonic transducers 7 is reduced, and an electric current flowing through the ultrasonic transducers 7 during resonance is increased. Therefore, an abnormality of the boil-dry state may be detected by checking a change in magnitude of the driving current of the oscillator 30.

As described above, the ultrasonic cleaning device 1 can monitor, by applying the ultrasonic vibrations to the cleaning liquid by the ultrasonic transducer 5 having a state monitoring function fixed to the outside of the cleaning bath 2, analyzing the voltage waveforms output from the state monitoring piezoelectric element 12, and comparing the voltage waveforms with an amplitude of the voltage or a frequency of the voltage at the time of driving in a normal state, the state of the ultrasonic transducer 5 having a state monitoring function by a change in amplitude of the voltage or in frequency of the voltage. Further, the state of the ultrasonic transducer 5 having a state monitoring function can be monitored using both of the changes in amplitude and frequency of the voltage.

Measurement of Vibration State

Next, results of measuring a vibration state with a plurality of ultrasonic transducers 7 being arranged at the bottom of a cleaning bath 2 of an ultrasonic cleaning device 1, and with an ultrasonic transducer 5 having a state monitoring function being arranged at a center position of the ultrasonic transducers 7 are described with reference to the drawings.

Figure 4:
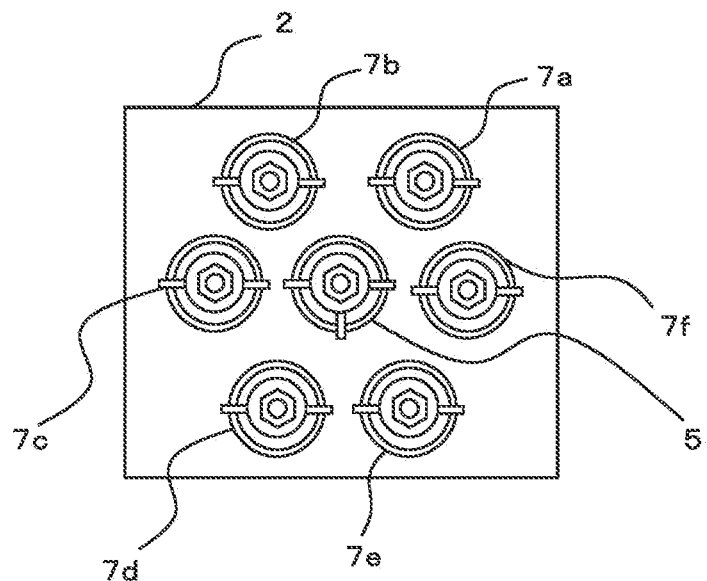
FIG. 4A is a bottom view for illustrating ultrasonic transducers and the ultrasonic transducer having a state monitoring function at the bottom of the cleaning bath of an ultrasonic cleaning device.
FIG. 4B is a diagram for illustrating connection between the ultrasonic transducers and the ultrasonic transducer having a state monitoring function, and the oscillator.
Figure 4:
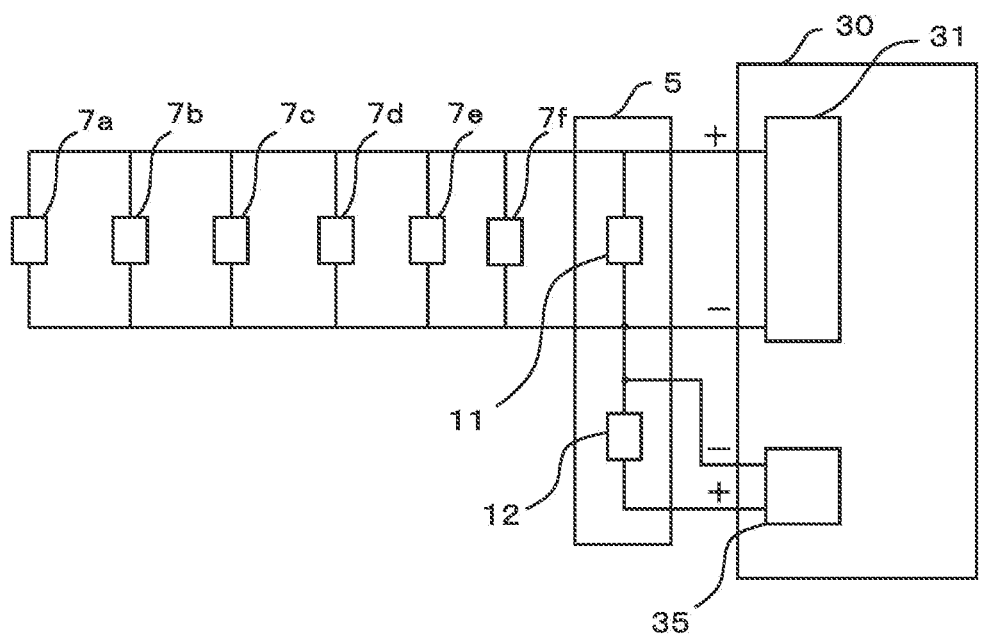

FIG. 4A is a bottom view for illustrating the arrangement of the ultrasonic transducers and the ultrasonic transducer having a state monitoring function at the bottom of the cleaning bath of the ultrasonic cleaning device, and FIG. 4B is a diagram for illustrating connection between the ultrasonic transducers and the ultrasonic transducer having a state monitoring function, and the oscillator. As illustrated in FIG. 4A, on the bottom of the cleaning bath 2 of the ultrasonic cleaning device 1, a total of six ultrasonic transducers 7a, 7b, 7c, 7d, 7e, and 7f are mounted on a circumference of a virtual circle having a predetermined size at intervals of about 60°, and an ultrasonic transducer 5 having a state monitoring function is arranged at a center position of the virtual circle.

Further, as illustrated in FIG. 4B, the vibration exciting piezoelectric elements 11 of the ultrasonic transducers 7a, 7b, 7c, 7d, 7e, and 7f, and the ultrasonic transducer 5 having a state monitoring function are connected in parallel to the output control section 31 of the oscillator 30. Still further, the state monitoring piezoelectric element 12 of the ultrasonic transducer 5 having a state monitoring function is connected to the monitoring unit section 35 of the oscillator 30.

Figure 5:
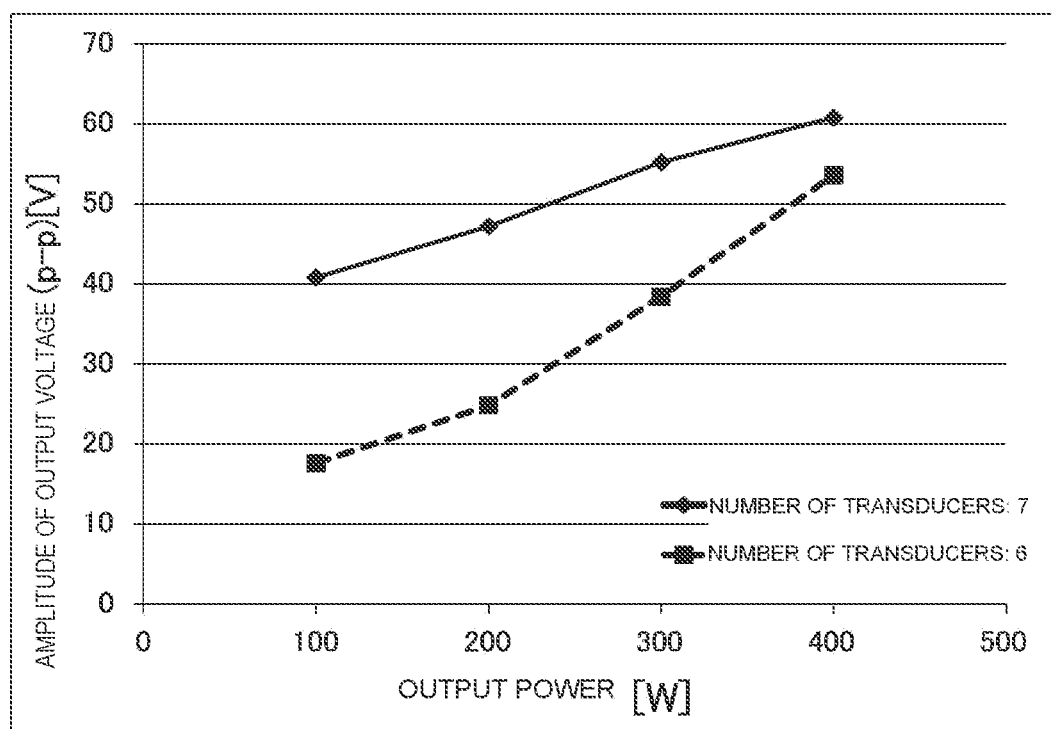
FIG. 5 is a graph for showing results of measuring an amplitude of a voltage by the state monitoring piezoelectric element under a state in which a total of seven ultrasonic transducers including six ultrasonic transducers attached to the cleaning bath of the ultrasonic cleaning device and one ultrasonic transducer having a state monitoring function are driven, and a state in which one of the ultrasonic transducers from the above-mentioned state is not electrically driven and a total of six ultrasonic transducers are driven.

Next, description is given of measurement results of the vibration state in the ultrasonic transducers and the ultrasonic transducer having a state monitoring function arranged at the bottom of the cleaning bath of the ultrasonic cleaning device illustrated in FIG. 4A. FIG. 5 is a graph for showing results of measuring an amplitude of a voltage by the state monitoring piezoelectric element under a state in which a total of seven transducers including six ultrasonic transducers attached to the cleaning bath of the ultrasonic cleaning device and one ultrasonic transducer having a state monitoring function are driven, and a state in which one of the ultrasonic transducers from the above-mentioned state is not electrically driven and a total of six ultrasonic transducers are driven.

In the measurement with the six transducers, assuming that degradation of the transducer, peeling from the cleaning bath, oscillation failure due to loosening of the bolt caused by a change with time, a disconnected line, or the like occurs in the ultrasonic transducer 7a illustrated in FIG. 4A, the measurement was performed without electrically driving (and while electrically disconnecting) the ultrasonic transducer 7a while being attached to the cleaning bath 2.

As shown in FIG. 5, with respect to the change in output power of the oscillator 30, when all the seven transducers normally vibrate, values indicated by "♦" (black diamonds) are obtained as the amplitude (p-p) of the output voltage of the state monitoring piezoelectric element 12. In contrast, when one of the six transducers does not vibrate, output values indicated by "■" (black squares) are obtained as the amplitude (p-p) of the output voltage of the state monitoring piezoelectric element 12. For example, the output values (amplitudes) of the voltage of the state monitoring piezoelectric element 12 with the electric power applied by the six transducers being from 100 watts (W) to 200 W are about half the output values for the seven transducers. Further, when the applied electric power exceeds 300 W, significant differences as in the cases of 100 watts (W) to 200 W are not observed. Therefore, it is checked whether the ultrasonic transducers 7 mounted on the cleaning bath 2 normally vibrate by applying even lower electric power of 100 watts (W) and checking the amplitude of the output voltage from the state monitoring piezoelectric element 12 so that abnormality detection can be performed through comparison with the normal state.

Further, the ultrasonic cleaning device 1 can apply ultrasonic vibrations to the cleaning liquid by the ultrasonic transducers 7 fixed to the outside of the cleaning bath 2, analyze the voltage waveforms output from the state monitoring piezoelectric element 12, and monitor the states of the ultrasonic transducers 7 with a change in frequency of the voltage. Still further, both of the changes in amplitude and frequency of the voltage can be used to monitor the states of the ultrasonic transducers 7.

"Processing Relating to State Monitoring of Ultrasonic Transducers"

Next, processing relating to state monitoring of the ultrasonic transducers 7 in the ultrasonic cleaning device 1 is described with reference to FIG. 6 and FIG. 7.

In the processing of monitoring the states of the ultrasonic transducers 7, processing of storing the output voltage from the state monitoring piezoelectric element 12 under the state in which the ultrasonic transducers 7 vibrate in the normal state in advance is performed first. Next, based on data of the output voltage stored in the processing section 37, processing of diagnosing a failure, for example, detecting an abnormality of a vibration exciting piezoelectric element 11 of the ultrasonic transducers 7 and the ultrasonic transducer 5 having a state monitoring function, is performed.

Figure 6:
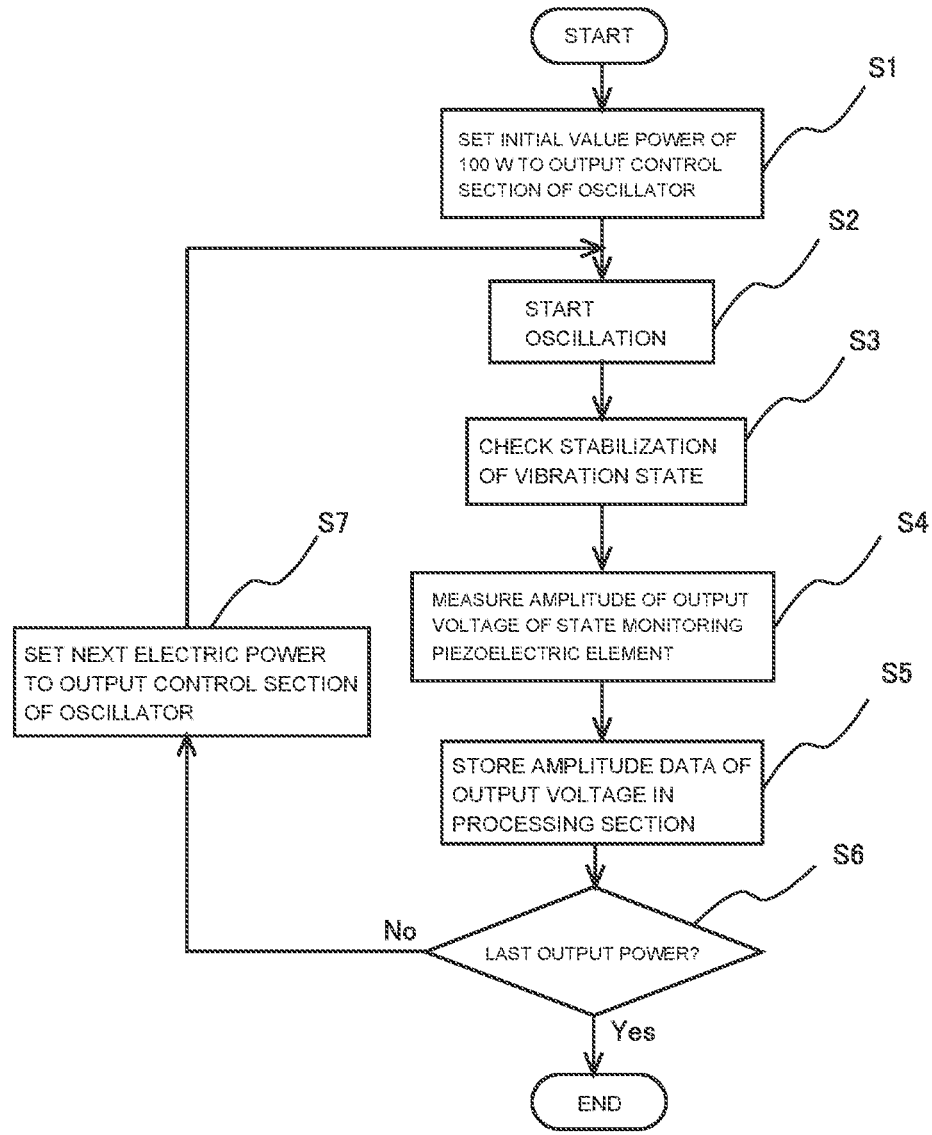
FIG. 6 is a flow chart for illustrating processing of storing the output voltage from the state monitoring piezoelectric element in a case in which the ultrasonic transducers vibrate in a normal state.
Figure 7:
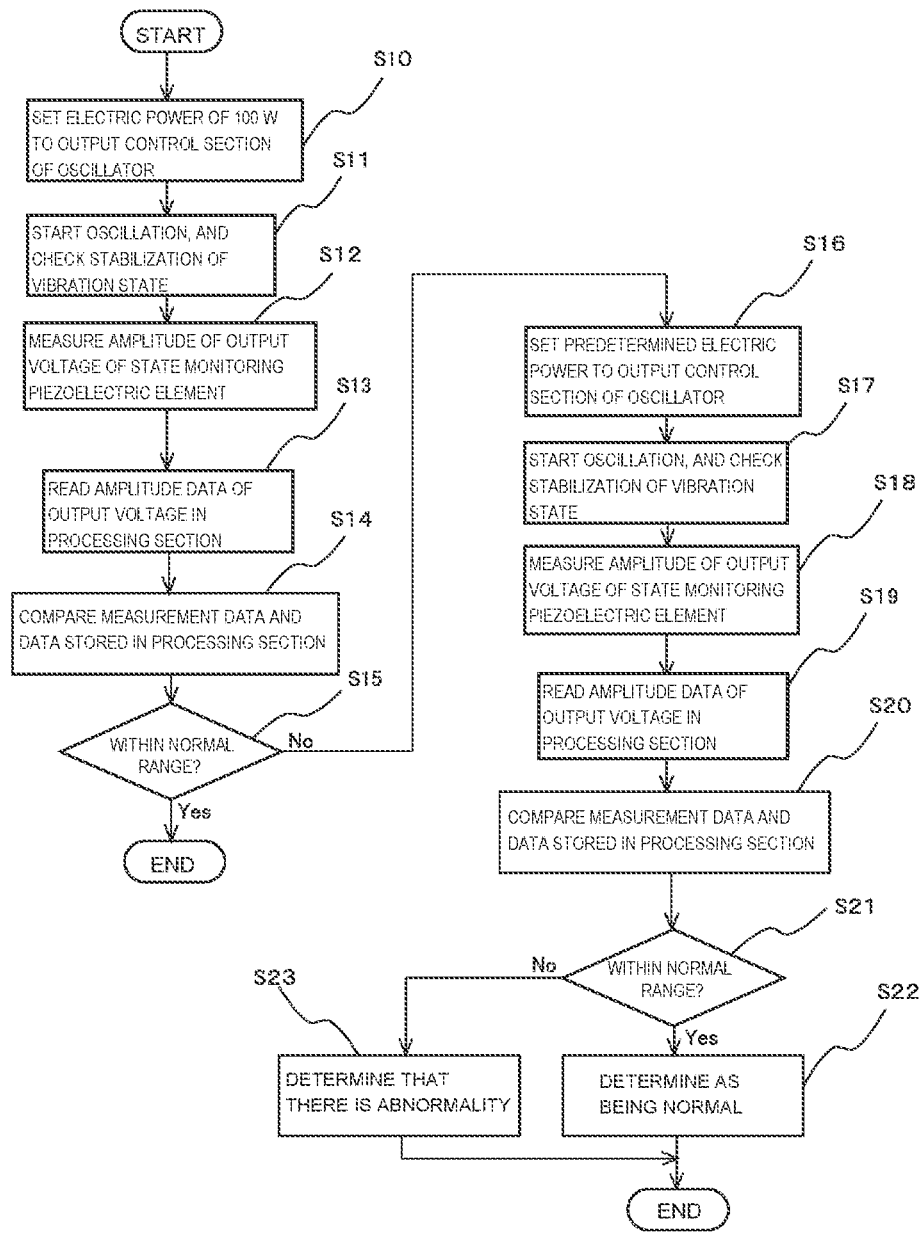
FIG. 7 is a flow chart for illustrating processing of diagnosing a failure of an ultrasonic transducer in the ultrasonic cleaning device.

FIG. 6 is a flow chart for illustrating the processing of storing the output voltage from the state monitoring piezoelectric element 12 under the state in which the ultrasonic transducers 7 vibrate in the normal state, and FIG. 7 is a flow chart for illustrating processing of diagnosing a failure of an ultrasonic transducer 7 in the ultrasonic cleaning device 1.

[Storage Processing Under Normal State]

As illustrated in FIG. 6, processing of storing the amplitude of the output voltage from the state monitoring piezoelectric element 12 under the state in which the vibration exciting piezoelectric elements 11 of the ultrasonic transducers 7 and the ultrasonic transducer 5 having a state monitoring function vibrate normally is performed. For example, the measurement of the amplitude of the output voltage from the state monitoring piezoelectric element 12 is performed in a range in which the output power is from 100 W to 400 W for every 100 W.

First, electric power having low power of 100 W to be used in an abnormality detection mode at the time when the ultrasonic transducers 7 and the ultrasonic transducer 5 having a state monitoring function operate normally is set to the output control section 31 of the oscillator 30 (Step S1).

A signal for starting the application of the electric power is output to the output control section 31 to start oscillation (Step S2).

Next, in order to ensure stability of the vibration state, it is waited until a predetermined time at which the vibrations of the ultrasonic transducers 7 are stabilized, for example (Step S3).

After the predetermined time has elapsed, the amplitude of the output voltage of the state monitoring piezoelectric element 12 is measured (Step S4). A waveform output from the monitoring unit section 35 of the oscillator 30 is read to measure the amplitude of the voltage.

The processing section 37 stores amplitude data of the output voltage in a storage device (Step S5).

Next, it is checked whether the electric power set to the output control section 31 of the oscillator 30 is the last output power (Step S6). When the electric power is not the last output power as in a case in which the electric power is low power of 200 W, for example, or a case in which there is another value of output power for measuring the amplitude, for example, an output during a normal cleaning operation (No in Step S6), the next electric power is set to the output control section 31 of the oscillator 30 (Step S7), and the process proceeds to Step S2. In particular, by measuring the amplitude of the voltage for the output power during the normal cleaning operation and storing amplitude data in the storage device (Step S4 and Step S5), a comparison with an abnormal state to be described later can be made, and determination can be made that, although there is an abnormality in a part of the ultrasonic transducers, there is no abnormality in the vibration state of the entire ultrasonic cleaning device, and that repair or replacement is not required yet because the normal cleaning operation is not hindered. Further, when the electric power is the last output power (Yes in Step S6), the processing is ended. As a result, data of the amplitude of the output voltage from the state monitoring piezoelectric element 12 under the state of normal vibration is stored in the processing section 37.

As illustrated in FIG. 6, the amplitude of the output voltage from the state monitoring piezoelectric element 12 under the state in which the ultrasonic transducers 7 normally vibrate is stored. Instead of storing the amplitude of the output voltage, the frequency of the output voltage, or both of the amplitude and the frequency of the output voltage may be stored.

[Processing in Abnormality Detection Mode]

Processing in the abnormality detection mode illustrated in FIG. 7 is processing using the amplitude of the output voltage from the state monitoring piezoelectric element under the state of vibrating in the normal state illustrated in FIG. 6, but in a case in which, instead of storing the amplitude of the output voltage, the frequency of the output voltage, or both of the amplitude and the frequency of the output voltage are stored, the processing of abnormality detection is performed with use of those pieces of stored data of the output voltage.

First, low power of 100 W is set to the output control section 31 of the oscillator 30 (Step S10). A signal for starting the application of the electric power is output to the output control section 31 to start oscillation, and in order to ensure stability of the vibration state, it is waited until a predetermined time at which the oscillations of the ultrasonic transducers are stabilized, for example (Step S11).

After the predetermined time has elapsed, the amplitude of the output voltage of the state monitoring piezoelectric element 12 is measured (Step S12). A waveform output from the monitoring unit section 35 of the oscillator 30 is read (Step S13), and the amplitude data of the output voltage stored in the processing section 37 is read to compare measurement data and the data stored in the processing section 37 (Step S14).

The measurement data and the data stored in the processing section 37 are compared to check whether the measurement data is within a normal range (Step S15). When it is determined that the measurement data is within the normal range (Yes in Step S15), it is considered that there is no abnormality in the vibration state, and the result of processing is displayed on the screen display section 36 to end the processing.

In contrast, when it is determined that the measurement data is outside the normal range (No in Step S15), electric power to be used in cleaning, for example, output of 400 W, is set to the output control section 31 of the oscillator 30 (Step S16). A signal for starting the application of the electric power is output to the output control section 31 to start oscillation, and in order to ensure stability of the vibration state, it is waited until a predetermined time at which the oscillations of the ultrasonic transducers 7 are stabilized, for example (Step S17).

After the predetermined time has elapsed, the amplitude of the output voltage of the state monitoring piezoelectric element 12 is measured (Step S18). A waveform output from the monitoring unit section 35 of the oscillator 30 is read, and the amplitude data of the output voltage stored in the processing section 37 is read (Step S19) to compare measurement data and the data stored in the processing section 37 (Step S20).

The measurement data and the data stored in the processing section 37 are compared to check whether the measurement data is within a normal range (Step S21). When it is determined that the measurement data is in the normal range (Yes in Step S21), it is determined that, although there is an abnormality in a part of the ultrasonic transducers, there is not abnormality in the vibration state of the entire ultrasonic cleaning device, and that repair or replacement is not required yet because the normal cleaning operation is not hindered (Step S22), and the result of the processing is displayed on the screen display section 36 to end the processing. Further, when it is determined that the measurement data is outside the normal range (No in Step S21), it is considered that there is an abnormality in the vibration state (Step S23), and the result of processing is displayed on the screen display section 36 to end the processing.

As described above, the ultrasonic cleaning device can perform abnormality determination of the ultrasonic transducers of the ultrasonic cleaning device by comparing at least one of the amplitude or the frequency of the voltage output from the state monitoring piezoelectric element of the ultrasonic transducer having a state monitoring function, and at least one of the amplitude or the frequency of the voltage output from the state monitoring piezoelectric element of the ultrasonic transducer having a state monitoring function at the time when the ultrasonic cleaning device is driven in the normal state.

[Estimation of Position of Failure]

Further, a position of a failure of ultrasonic transducers arranged two-dimensionally on a cleaning bath of an ultrasonic cleaning device can be estimated with use of a plurality of ultrasonic transducers having a state monitoring function. Still further, when the ultrasonic transducer having a state monitoring function itself has failed, that is, for example, when peeling from the cleaning bath occurs in the ultrasonic transducer having a state monitoring function, the amplitude of the voltage output from the state monitoring piezoelectric element of the ultrasonic transducer having a state monitoring function is increased as compared to that in the normal operation, and hence the failure of the ultrasonic transducer having a state monitoring function itself can also be estimated.

Figure 8:
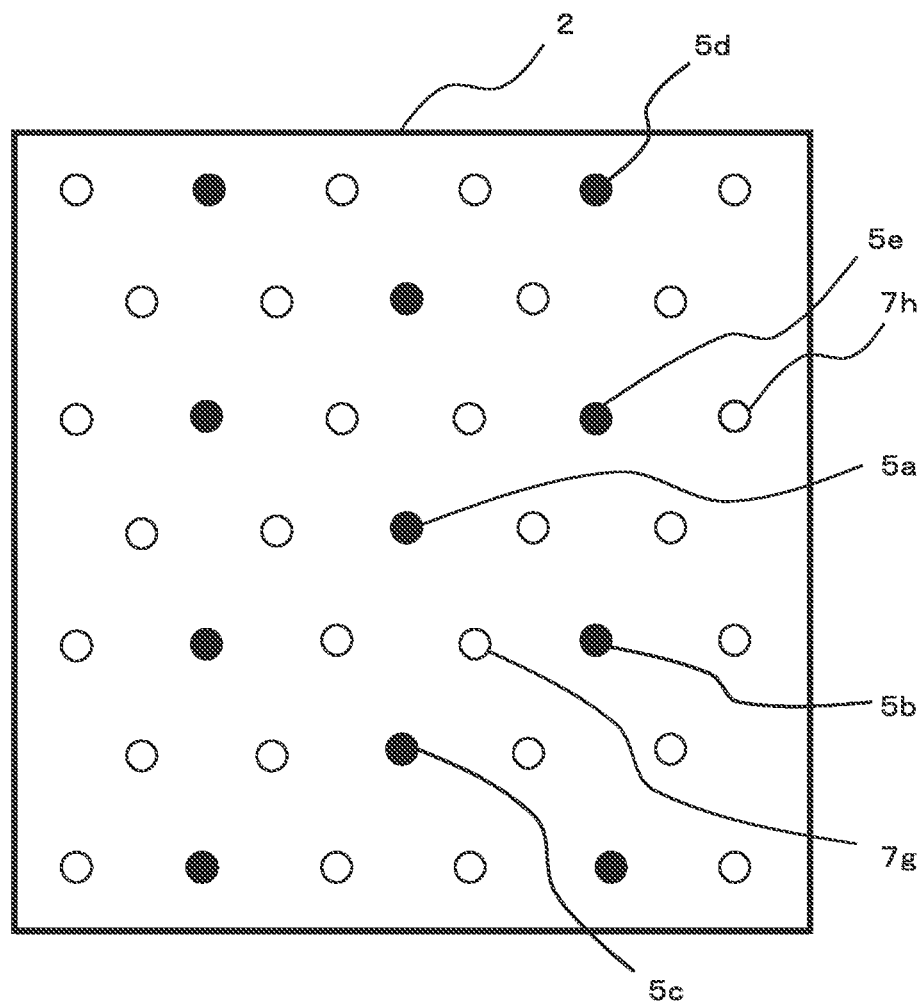
FIG. 8 is a view for illustrating an example of arrangement of ultrasonic transducers and ultrasonic transducers having a state monitoring function, which are provided on a cleaning bath of an ultrasonic cleaning device.

FIG. 8 is a view for illustrating an example of arrangement of ultrasonic transducers and ultrasonic transducers having a state monitoring function provided on a cleaning bath of an ultrasonic cleaning device. As illustrated in FIG. 8, positions of the ultrasonic transducers provided on a bottom surface of the cleaning bath 2 are indicated by circles (○), and positions of the ultrasonic transducers having a state monitoring function are indicated by black circles (●). In the following description, positions of the ultrasonic transducers on the drawings are indicated by the mark "○", and the positions of the ultrasonic transducers having a state monitoring function are indicated by the mark "●".

For example, when an ultrasonic transducer 7g illustrated in FIG. 8 has failed, amplitudes of voltages output from ultrasonic transducers 5a, 5b, and 5c having a state monitoring function around the ultrasonic transducer 7g become smaller, and it is estimated that the ultrasonic transducer 7g has failed based on the changes in amplitude of the voltages output from the ultrasonic transducers 5a, 5b, and 5c having a state monitoring function.

Further, when an ultrasonic transducer 7h illustrated in FIG. 8 has failed, an amplitude of a voltage output from an ultrasonic transducer 5e having a state monitoring function, which is located at a distance closest to the ultrasonic transducer 7h, becomes smaller, and further, amplitudes of voltages output from ultrasonic transducers 5b and 5d having a state monitoring function, which are located at a distance second closest to the ultrasonic transducer 7h become smaller, and it is estimated that the ultrasonic transducer 7h has failed based on the amplitudes of the voltages from the ultrasonic transducers 5e, 5b, and 5d having a state monitoring function.

The estimation of the position of the failure of the ultrasonic transducers and the ultrasonic transducers having a state monitoring function provided two-dimensionally on the cleaning bath of the ultrasonic cleaning device has been described above, but also in, for example, a spot shower in which an ultrasonic transducer is used alone, the ultrasonic transducer can be replaced with an ultrasonic transducers having a state monitoring function. Through the replacement with the ultrasonic transducers having a state monitoring function, an abnormal state can be detected from an amplitude of a voltage output from a state monitoring piezoelectric element, and self-diagnosis of the spot shower can be performed.

[Use in Line Shower]

Figure 9:
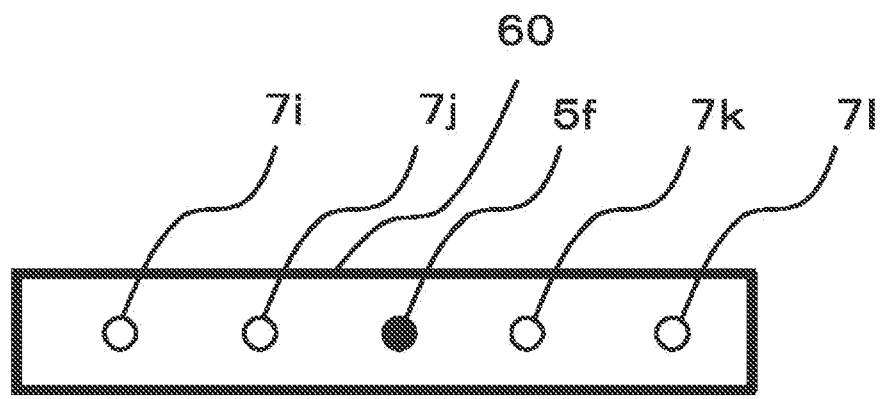
FIG. 9 is a view for illustrating an example of a line shower using an ultrasonic transducer having a state monitoring function.

Next, use of an ultrasonic transducer having a state monitoring function in a line shower is described. FIG. 9 is a view for illustrating an example of a line shower using the ultrasonic transducer having a state monitoring function. As illustrated in FIG. 9, an ultrasonic transducer 5f having a state monitoring function is provided near the center in a longitudinal direction of a line shower 60. Further, on both sides of the ultrasonic transducer 5f having a state monitoring function in the longitudinal direction of the line shower 60, ultrasonic transducers 7j and 7k are arranged at an equal distance at positions close to the ultrasonic transducer 5f having a state monitoring function, and ultrasonic transducers 7i and 7l are arranged at an equal distance at farther positions.

In this manner, amplitudes of output voltages of the ultrasonic transducer 5f having a state monitoring function caused by the ultrasonic transducers 7i and 7l arranged at the positions farther from the ultrasonic transducer 5f having a state monitoring function become smaller than amplitudes caused by the ultrasonic transducers 7j and 7k arranged at the close positions.

For example, when any one of the ultrasonic transducers located on both sides of the ultrasonic transducer 5f having a state monitoring function has failed, a magnitude of the amplitudes of the output voltages of the ultrasonic transducer 5f having a state monitoring function is changed depending on a distance from the ultrasonic transducer 5f having a state monitoring function, and hence it can be estimated that any one of the ultrasonic transducers 7i and 7l or the ultrasonic transducers 7j and 7k, which are paired and separated by the same distance from both sides of the ultrasonic transducer 5f having a state monitoring function, has failed.

Figure 10:
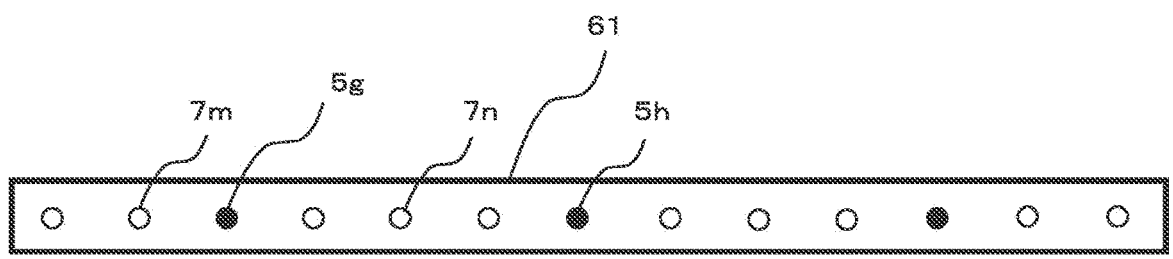
FIG. 10 is a view for illustrating an example of a line shower using a plurality of ultrasonic transducers having a state monitoring function.

FIG. 10 is a view for illustrating an example of a line shower using a plurality of ultrasonic transducers having a state monitoring function. As illustrated in FIG. 10, with the plurality of ultrasonic transducers having a state monitoring function being provided in a longitudinal direction of a line shower 61, a failed ultrasonic transducer can be identified. For example, when an ultrasonic transducer 7m has failed, with a reduction in magnitude of an amplitude of an output voltage of an ultrasonic transducer 5g having a state monitoring function, the failed ultrasonic transducer 7m can be estimated. Further, when an ultrasonic transducer 7n has failed, with changes in amplitude of output voltages of ultrasonic transducers 5g and 5h having a state monitoring function, that is, because diminutions in amplitudes are equal for ultrasonic transducers 5g and 5h, the failed ultrasonic transducer 7n can be estimated.

[Abnormality Detection from Phases of Voltage]

Further, the ultrasonic cleaning device 1 according to the at least one embodiment of the present invention can apply ultrasonic vibrations to the cleaning liquid by a plurality of ultrasonic transducers 7 fixed to the outside of the cleaning bath 2, analyze, from voltages output from the state monitoring piezoelectric element 12 of the ultrasonic transducer 5 having a state monitoring function, a voltage waveform that is different for each of the ultrasonic vibrations generated from the ultrasonic transducers 7 arranged around the ultrasonic transducer 5 having a state monitoring function, and estimate an ultrasonic transducer 7 in an abnormal state based on a phase of the voltage waveform.

In other words, when distances of the ultrasonic transducers 7 arranged around the ultrasonic transducer 5 having a state monitoring function on the cleaning bath 2 to the ultrasonic transducer 5 having a state monitoring function are different, with different propagation times of vibrations generated from the ultrasonic transducers 7 to the state monitoring piezoelectric element, a phase difference occurs between a waveform of a voltage output from the oscillator 30 and a waveform of the ultrasonic transducer 5 having a state monitoring function.

Figure 11:
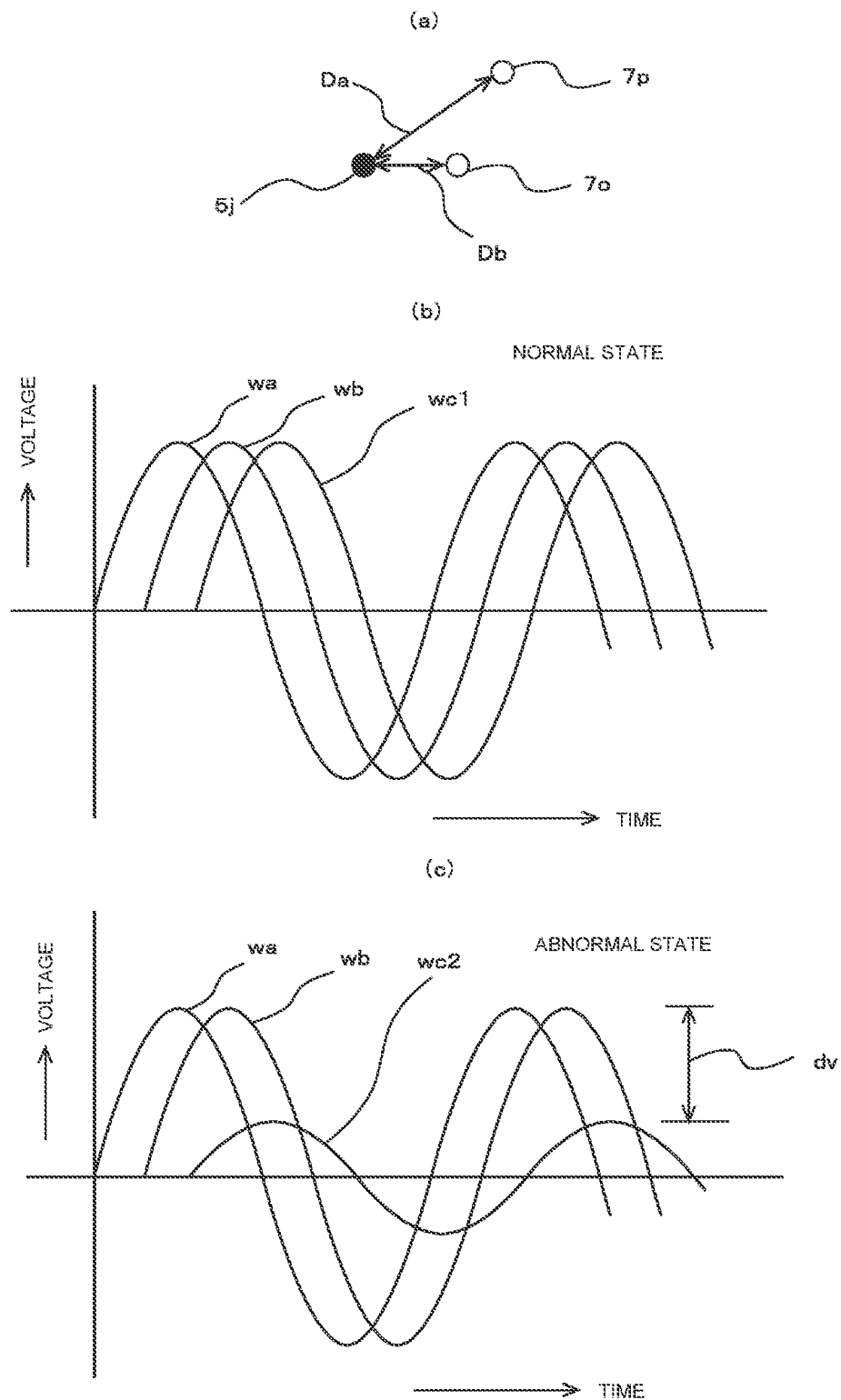
Figure 12:
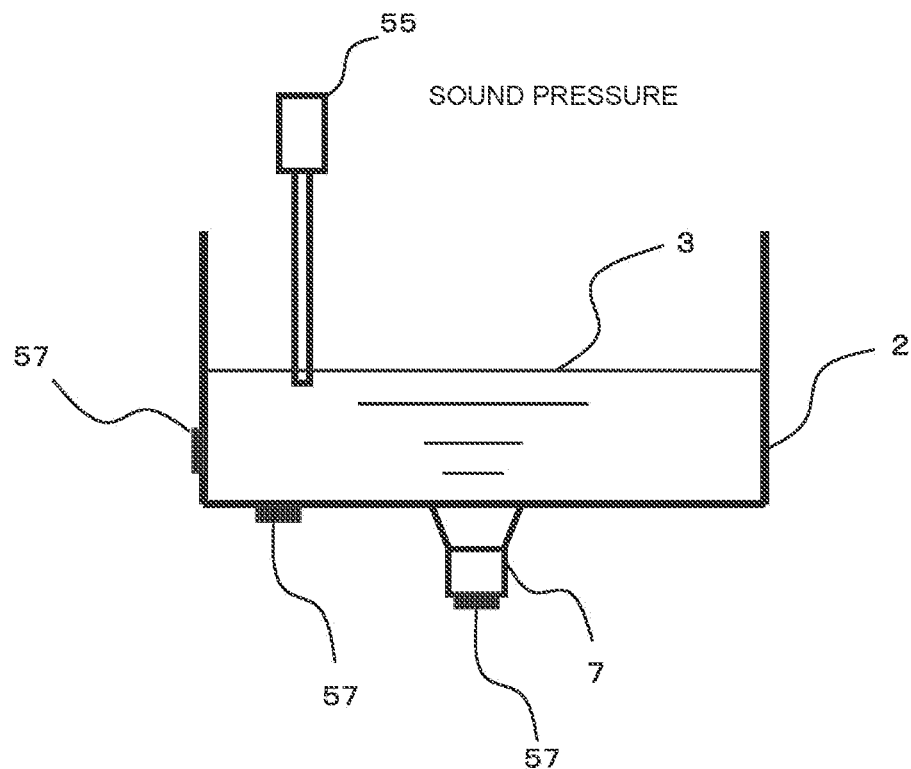
FIG. 12 is a view for illustrating, as a related art, positions of acceleration sensors attached to a cleaning bath of an ultrasonic cleaning device, and of a sound pressure meter in cleaning liquid.

FIG. 11A and FIG. 11B are a view and graphs for illustrating and showing estimation of a failed ultrasonic transducer with use of, in addition to amplitudes of output voltages from an ultrasonic transducer having a state monitoring function, the phase difference of the output voltages, in which FIG. 11A is a view for illustrating arrangement of the ultrasonic transducer having a state monitoring function and the ultrasonic transducers, FIG. 11B is a graph for showing waveforms of output voltages from the ultrasonic transducer having a state monitoring function caused by the transducers in the normal state, and FIG. 11C is a graph for showing waveforms of output voltages from the ultrasonic transducer having a state monitoring function caused by the transducers in an abnormal state of one ultrasonic transducer.

As illustrated in FIG. 11A, an ultrasonic transducer 5j having a state monitoring function, and ultrasonic transducers 7o and 7p located in the vicinity thereof are arranged. A distance between the ultrasonic transducer 5j having a state monitoring function and the ultrasonic transducer 7p is represented by Da, a distance between the ultrasonic transducer 5j having a state monitoring function and the ultrasonic transducer 7o is represented by Db, and a state in which the distance Da is longer than the distance Db is shown.

In the normal state of the ultrasonic transducer 5j having a state monitoring function and the ultrasonic transducers 7o and 7p, an output waveform of the state monitoring piezoelectric element 12 caused by vibrations of the vibration exciting piezoelectric element 11 of the ultrasonic transducer 5j having a state monitoring function is represented by "wa", an output waveform of the state monitoring piezoelectric element 12 of the ultrasonic transducer 5j having a state monitoring function caused by vibrations of the ultrasonic transducer 7o is represented by "wb", and "wb" is delayed in phase with respect to "wa". Further, an output waveform of the state monitoring piezoelectric element 12 of the ultrasonic transducer 5j having a state monitoring function caused by vibrations of the ultrasonic transducer 7p is represented by "wc1", and "wc1" is delayed in phase with respect to "wa" and "wb".

In the normal state of the vibration exciting piezoelectric elements 11 of the ultrasonic transducer 5j having a state monitoring function and the ultrasonic transducers 7o and 7p, an output waveform of the state monitoring piezoelectric element 12 of the ultrasonic transducer 5j having a state monitoring function is obtained by synthesizing the waveforms "wa", "wb", and "wc1". Further, from the synthesized waveform output by the state monitoring piezoelectric element 12 of the ultrasonic transducer 5j having a state monitoring function, the output waveforms "wa", "wb", and "wc1" of the vibration exciting piezoelectric elements 11 of the ultrasonic transducer 5j having a state monitoring function and the ultrasonic transducers 7o and 7p, respectively, can be extracted.

Further, as shown in FIG. 11C, an amplitude of an output waveform "wc2" obtained when the ultrasonic transducer 7p illustrated in FIG. 11A is in an abnormal state is reduced in magnitude with occurrence of a voltage drop represented by dv with respect to "wc1" shown in FIG. 11B. An output waveform of the state monitoring piezoelectric element 12 of the ultrasonic transducer 5j having a state monitoring function obtained when the ultrasonic transducer 7p is in the abnormal state is obtained by synthesizing the waveforms "wa", "wb", and "wc2". From the synthesized waveform output by the state monitoring piezoelectric element 12 of the ultrasonic transducer 5j having a state monitoring function, the output waveforms "wa", "wb", and "wc2" of the vibration exciting piezoelectric elements 11 of the ultrasonic transducer 5j having a state monitoring function and the ultrasonic transducers 7o and 7p, respectively, can be extracted. As a result, the waveform "wc2" of the ultrasonic transducer 7p is different from the waveform "wc1" in the normal state, and hence the failed ultrasonic transducer can be estimated.

As described above, through comparison of the output waveforms of the state monitoring piezoelectric element 12 of the ultrasonic transducer 5j having a state monitoring function obtained in the normal state and the abnormal state, the abnormal ultrasonic transducer can be identified. In this manner, with use of, in addition to the amplitude of the output voltage from the ultrasonic transducer having a state monitoring function, the phase difference of the voltages of the ultrasonic transducer having a state monitoring function, the failed ultrasonic transducer can be estimated.

Also in the line shower, with use of, in addition to the amplitude of the output voltage from the ultrasonic transducer having a state monitoring function, the phase difference of the voltages of the ultrasonic transducer having a state monitoring function, the failed ultrasonic transducer can be estimated.

As described above, voltage waveforms different for the ultrasonic vibrations generated from the respective ultrasonic transducers arranged around the ultrasonic transducer 5 having a state monitoring function can be analyzed to estimate the ultrasonic transducer in the abnormal state from the amplitudes and the phases of the voltage waveforms.

It is also possible to estimate the presence of the ultrasonic transducer in the abnormal state from the reduction in amplitude of the voltage waveform, and estimate a distance to the ultrasonic transducer in the abnormal state from the phase difference.

It is further possible to analyze, from the voltages output from the state monitoring piezoelectric element of the ultrasonic transducer 5 having a state monitoring function at the time when the ultrasonic cleaning device 1 is driven in the normal state, voltage waveforms different for the ultrasonic vibrations generated from the respective ultrasonic transducers 7 arranged around the ultrasonic transducer 5 having a state monitoring function, and estimate the failed ultrasonic transductor by comparing with the amplitudes and the phases of the voltage waveforms.

As described above, the ultrasonic cleaning device 1 according to the at least one embodiment of the present invention can analyze, through use of the ultrasonic transducer 5 having a state monitoring function, the voltage output from the state monitoring piezoelectric element, estimate the ultrasonic transducer in the abnormal state from a reduction in amplitude of the voltage waveforms, and estimate the ultrasonic transducer 7 in the abnormal state also from the phase difference between the waveform of the voltage output from the oscillator 30 and the waveform of the ultrasonic transducer 5 having a state monitoring function.

As descried above, in the ultrasonic transducer having a state monitoring function according to the at least one embodiment of the present invention, through incorporation of a part of the plurality of piezoelectric elements as the vibration exciting piezoelectric element and another part of the plurality of piezoelectric elements as the state monitoring piezoelectric element, and comparison of at least one of the amplitude or the frequency of the voltage output from the state monitoring piezoelectric element with that in normal times, abnormality determination of the ultrasonic transducer having a state monitoring function can be performed.

Further, in the ultrasonic transducer having a state monitoring function according to the at least one embodiment of the present invention, another part of the plurality of piezoelectric elements is incorporated as the state monitoring piezoelectric element. Therefore, the abnormal state of the vibrations of not only a part of the plurality of piezoelectric elements but also ultrasonic transducers provided around the ultrasonic transducer having a state monitoring function can be detected with high accuracy.

According to the ultrasonic transducer 5 having a state monitoring function of the at least one embodiment of the present invention, the vibrations of the ultrasonic transducers can be observed directly, and hence no large-scale device is required.

Further, the state monitoring piezoelectric element as the sensor is embedded in the related-art ultrasonic transducer itself so that no space for the sensor is required, and hence the configuration can be simplified. Further, the method of attaching the ultrasonic transducer having a state monitoring function to the cleaning bath is the same as in the related art, and no change to assembly steps for the ultrasonic cleaning device 1 is required.

Further, when a plurality of ultrasonic transducers having a state monitoring function are incorporated, an ultrasonic transducer at an abnormality location can be identified.

According to the ultrasonic cleaning device using the ultrasonic transducer having a state monitoring function of the at least one embodiment of the present invention, with the provision of the ultrasonic transducer having a state monitoring function, the vibration states of the ultrasonic transducers on the cleaning bath can be detected from the output voltages from the state monitoring piezoelectric element.

Further, in the ultrasonic transducer having a state monitoring function according to the at least one embodiment of the present invention, the plurality of piezoelectric elements are arranged to be stacked on each other, and the another part of the plurality of piezoelectric elements is fixed in the pressurized state as the state monitoring piezoelectric element, as opposed to the related-art sensor, which is attached by bonding, for example, and hence no variation in measurement due to peeling of the sensor, adhesion failure, or degradation of the adhesive occurs.

In the ultrasonic transducer having a state monitoring function according to the at least one embodiment of the present invention, the another part of the plurality of piezoelectric elements is incorporated as the state monitoring piezoelectric element, and thus the voltage output from the state monitoring piezoelectric element substantially matches with the measurement result of the laser Doppler device used for measuring a vibration operation of a transducer. Accordingly, such a large-scale device as the laser Doppler device is not required.

Further, the ultrasonic transducer having a state monitoring function according to the at least one embodiment of the present invention can be used as, without limiting to the transducer of the ultrasonic cleaning device which irradiates the cleaning bath with ultrasonic wave for cleaning, a transducer in a spot shower, a line shower, or a throw-in transducer, for example. Still further, those transducers can be applied to a cleaning device which cleans an object to be cleaned from the transducers via the cleaning liquid.

In the above, the at least one embodiment of the present invention is described, but this embodiment is presented as an example, and is not intended to limit the scope of the invention. This embodiment may be implemented in other various modes, and various kinds of omissions, replacements, and modifications can be made thereto without departing from the gist of the invention. Those replacements and modifications thereof are included in the scope and gist of the invention, and are included in the scopes of the invention described in the appended claims and their equivalents.

Further, the functional blocks illustrated in the functional block diagram of FIG. 2 show functional components of the at least one embodiment of the present invention, and do not limit specific embodiment modes. In other words, it is not required to implement hardware corresponding to the functional blocks illustrated in the figure, and it is of course possible that one processor executes programs to achieve functions of a plurality of functional sections. In addition, a part of the functions achieved by software in the embodiment may be achieved by hardware, and further, a part of the functions achieved by hardware may be achieved by software.

What is claimed is:

1. An ultrasonic cleaning device, comprising:
a plurality of Langevin ultrasonic transducers configured to apply ultrasonic vibrations to cleaning liquid, the ultrasonic cleaning device configured to clean an object to be cleaned via the cleaning liquid to which the ultrasonic vibrations are applied by the plurality of Langevin ultrasonic transducers; and
a processing section configured to monitor a vibration state of the ultrasonic vibrations applied by the plurality of Langevin ultrasonic transducers, wherein
the plurality of Langevin ultrasonic transducers include a plurality of state monitoring ultrasonic transducers having a state monitoring function,
each one of the plurality of state monitoring ultrasonic transducers comprises a plurality of piezoelectric elements, which are arranged to be stacked on each other and are expandable and contractable in a direction of the stacking,
a part of the plurality of piezoelectric elements serves as a vibration exciting piezoelectric element configured to expand and contract by being applied with an AC voltage,
another part of the plurality of piezoelectric elements serves as a state monitoring piezoelectric element, which is fixed to the vibration exciting piezoelectric element in a pressurized state, and is configured to output a state monitoring voltage by the expansion and contraction of the vibration exciting piezoelectric element, and
the processing section is configured to:
monitor a state of each one of the plurality of Langevin ultrasonic transducers with a change in at least one of an amplitude or a frequency of the state monitoring voltage output from one or more of the state monitoring piezoelectric elements included in one or more of the plurality of state monitoring ultrasonic transducers around each one of the plurality of Langevin ultrasonic transducers; and
estimate a position of one of the plurality of Langevin ultrasonic transducers in an abnormal state from one or more positions of the one or more of the state monitoring piezoelectric elements from which the change is detected.

2. The ultrasonic cleaning device according to claim 1, wherein a detection of the change is performed by comparing at least one of the amplitude or the frequency of the state monitoring voltage output from the state monitoring piezoelectric element included in each one of the plurality of state monitoring ultrasonic transducers, and at least one of an amplitude or a frequency of the state monitoring voltage output from the state monitoring piezoelectric element included in each one of the plurality of state monitoring ultrasonic transducers at a time when the ultrasonic cleaning device is driven in a normal state.

3. The ultrasonic cleaning device according to claim 1, wherein the processing section is configured to analyze voltage waveforms, which are different for ultrasonic vibrations respectively generated from the plurality of Langevin ultrasonic transducers arranged around one or more of the state monitoring ultrasonic transducers, from the state monitoring voltage output from the state monitoring piezoelectric element included in each one of the plurality of state monitoring ultrasonic transducers, to estimate one of the plurality of Langevin ultrasonic transducers in the abnormal state from amplitudes and phases of the voltage waveforms.

4. The ultrasonic cleaning device according to claim 3, wherein an estimation of the one of the plurality of Langevin ultrasonic transducers in the abnormal state is performed by estimating presence of the one of the plurality of Langevin ultrasonic transducers in the abnormal state from a reduction in amplitude of one of the voltage waveforms, and estimating a distance to the one of the plurality of ultrasonic transducers in the abnormal state from a phase Langevin difference.

5. The ultrasonic cleaning device according to claim 4, wherein the estimation of the one of the plurality of Langevin ultrasonic transducers in the abnormal state is performed by analyzing, from the state monitoring voltage output from the state monitoring piezoelectric element included in the one of the plurality of state monitoring ultrasonic transducers at a time when the ultrasonic cleaning device is driven in a normal state, voltage waveforms, which are different for ultrasonic vibrations respectively generated from the plurality of Langevin ultrasonic transducers arranged around the one of the plurality of state monitoring ultrasonic transducers, and comparing with amplitudes and phases of the voltage waveforms.

\* \* \* \* \*